United States Patent
Liebhard et al.

(10) Patent No.: US 8,879,225 B2
(45) Date of Patent: *Nov. 4, 2014

(54) PROTECTIVE CIRCUIT FOR A RECHARGEABLE BATTERY PACK

(71) Applicant: Andreas Stihl AG & Co. KG, Waiblingen (DE)

(72) Inventors: Gernot Liebhard, Waiblingen (DE); Henrik Gaul, Schorndorf (DE)

(73) Assignee: Andreas Stihl AG & Co. KG, Waiblingen (DE)

( * ) Notice: Subject to any disclaimer, the term of this patent is extended or adjusted under 35 U.S.C. 154(b) by 86 days.

This patent is subject to a terminal disclaimer.

(21) Appl. No.: 13/726,448

(22) Filed: Dec. 24, 2012

(65) Prior Publication Data

US 2013/0163135 A1    Jun. 27, 2013

(30) Foreign Application Priority Data

Dec. 22, 2011   (DE) .......................... 10 2011 121 937

(51) Int. Cl.
| | |
|---|---|
| *H02H 3/00* | (2006.01) |
| *H01M 10/44* | (2006.01) |
| *H02H 7/18* | (2006.01) |
| *G01R 31/36* | (2006.01) |
| *H01M 10/48* | (2006.01) |
| *H02H 3/20* | (2006.01) |
| *H01M 2/10* | (2006.01) |
| *H01M 10/052* | (2010.01) |

(52) U.S. Cl.
CPC ........... *G01R 31/362* (2013.01); *H01M 10/441* (2013.01); *H01M 2/1022* (2013.01); *H02H 7/18* (2013.01); *G01R 31/3658* (2013.01); *H01M 10/052* (2013.01); *Y02E 60/12* (2013.01); *H01M 10/482* (2013.01); *H02H 3/20* (2013.01)
USPC ........................................................ 361/86

(58) Field of Classification Search
USPC ........................................................ 361/86
See application file for complete search history.

(56) References Cited

U.S. PATENT DOCUMENTS 5,818,201 A * 10/1998 Stockstad et al. ............. 320/119
6,331,764 B1 * 12/2001 Oglesbee et al. ............. 320/136

(Continued)

FOREIGN PATENT DOCUMENTS

WO    WO 02/30631 A2    4/2002

OTHER PUBLICATIONS

European Search Report of the European Patent Office dated Mar. 8, 2013 in the corresponding European patent application EP12008362.

*Primary Examiner* — Stephen W Jackson
(74) *Attorney, Agent, or Firm* — Walter Ottesen P.A.

(57) ABSTRACT

A protective circuit for an arrangement includes a multiplicity of individual cells in a rechargeable battery pack. A predefined number of individual cells are connected in series in a cell row and at least two cell rows are mutually parallel, and at least one cell connector situated between the individual cells at a location of one cell row is electrically connected via a compensation line to the cell connector situated at an identical location of the parallel cell row, and the potential of the cell connector connected to the compensation line at one location of one cell row and the potential of the cell connector electrically connected to the compensation line at the same location of the parallel cell row are detected and the detected potentials are fed to an evaluation unit.

18 Claims, 3 Drawing Sheets

(56) References Cited

U.S. PATENT DOCUMENTS

| | | |
|---|---|---|
| 6,627,345 B1 | 9/2003 | Zemlok et al. |
| 6,841,291 B2 | 1/2005 | Minamiura |
| 7,073,614 B2 | 7/2006 | Saito et al. |
| 7,498,774 B2 * | 3/2009 | Ziegler et al. ............ 320/150 |
| 7,553,583 B2 | 6/2009 | Eaves |
| 7,592,773 B2 | 9/2009 | Pellenc |
| 8,410,756 B2 | 4/2013 | Sakakibara et al. |
| 8,691,412 B2 | 4/2014 | Yonishi |
| 2004/0138785 A1 | 7/2004 | Emori et al. |
| 2005/0057221 A1 | 3/2005 | Desilvestro et al. |
| 2008/0050645 A1 | 2/2008 | Kai et al. |
| 2010/0123434 A1 | 5/2010 | Iwata |
| 2010/0181966 A1 | 7/2010 | Sakakibara |
| 2010/0221590 A1 | 9/2010 | Reber |
| 2010/0221591 A1 | 9/2010 | Rosskamp et al. |
| 2010/0321025 A1 | 12/2010 | Lin et al. |
| 2011/0003182 A1 | 1/2011 | Zhu |
| 2011/0068744 A1 | 3/2011 | Zhu |
| 2011/0074354 A1 | 3/2011 | Yano |
| 2011/0097619 A1 | 4/2011 | Park |
| 2011/0248675 A1 | 10/2011 | Shiu et al. |
| 2011/0287287 A1 | 11/2011 | Kang |
| 2013/0162052 A1 | 6/2013 | Gaul et al. |
| 2013/0162055 A1 | 6/2013 | Reber et al. |
| 2013/0164600 A1 | 6/2013 | Rosskamp et al. |

* cited by examiner

PROTECTIVE CIRCUIT FOR A RECHARGEABLE BATTERY PACK

CROSS REFERENCE TO RELATED APPLICATION

This application claims priority of German patent application no. 10 2011 121 937.8, filed Dec. 22, 2011, the entire content of which is incorporated herein by reference.

FIELD OF THE INVENTION

The invention relates to a protective circuit for an arrangement comprising a multiplicity of individual cells in a rechargeable battery pack, wherein a predefined number of individual cells are connected in series in a cell row.

BACKGROUND OF THE INVENTION

Such rechargeable battery pack arrangements comprising, for example, cells based chemically on lithium are used in handheld work apparatus and are intended to ensure, in conjunction with high performance, a long service life of the apparatus supplied with power via the rechargeable battery pack.

A large cell network is only as good as its weakest cell; if one individual cell ages more rapidly than others, the cell row containing the weaker cell is impaired overall; in particular, compensation currents can flow within the rechargeable battery pack and restrict the performance of the entire rechargeable battery pack. If a defective cell is present, compensation currents can flow within the rechargeable battery pack even if no external load is present on the rechargeable battery pack. As a result, the individual cells in good condition have a higher self discharge.

SUMMARY OF THE INVENTION

It is an object of the invention to configure a protective circuit for an arrangement which includes a multiplicity of individual cells in a rechargeable battery pack in such a manner that, without complex monitoring, the failure of an individual cell in the entire cell arrangement can be identified rapidly and reliably.

The protective circuit of the invention is for an arrangement having a plurality of individual cells in a battery pack, wherein a predetermined number of individual cells are connected in series via cell connectors so as to form a cell row and at least two cell rows are arranged in parallel, the cell connectors having a respective potential ($U_{nr}$, $U_{nl}$), each of the individual cells of one cell row having a position which corresponds to the position of a corresponding one of the individual cells in the other cell row, each of the cell connectors of one cell row having a position therein which corresponds to the position of a corresponding one of the cell connectors in the other cell row, a plurality of compensation lines electrically interconnecting corresponding ones of the cell connectors of the different rows, the cell connectors having a respective potential ($U_{nr}$, $U_{nl}$). The protective circuit includes: an evaluation unit; a circuit device configured to detect the potential ($U_{nr}$) of the cell connector connected to the compensation line of one of the cell rows and the potential ($U_{nl}$) of the corresponding cell connector connected to the one compensation line of the other parallel cell row; the circuit device being further configured to output the detected potentials ($U_{nl}$, $U_{nr}$) to the evaluation unit.

If at least two cell rows are in parallel with one another and if the cell connectors are respectively provided between the individual cells of the row, then the cell connectors situated between the individual cells at a location of one cell row are electrically connected via a compensation line to the cell connector situated at an identical location of the parallel cell row. The potential of the cell connector connected to the compensation line at one location of one cell row is detected as a first measurement variable. The potential of the cell connector electrically connected to the compensation line at the identical location of the parallel cell row is likewise detected as a measurement variable. The detected potentials are fed to an evaluation unit and expediently evaluated in the latter, wherein the evaluation result allows a statement to be made about a defective cell at the location of the cell row.

If the individual cells of parallel cell rows are approximately equally strong and in the same condition, no appreciable currents will flow under load as in the rest state via the compensation line. Therefore, the potential of the cell connector at the location "2" in one row will be the same as the potential of the cell connector situated at an identical location "2" in the parallel cell row, which are furthermore connected to one another via the compensation line. If the cells age to different extents and, for example, break down under a load to a greater extent than other individual cells of a cell row, a compensation current will flow via the compensation line in order to support the weaker cell. On account of the compensation current in the compensation line and the voltage dropped across the ohmic resistance of the line as a result, the potentials of the cell connectors connected to one another will change differently. The potential difference between the two cell connectors of the same location of parallel cell rows is therefore a measure of the compensation current and therefore an indicator of a defective individual cell.

By evaluating the potentials of the cell connectors of one cell row with the corresponding potentials of the cell connectors of the other cell row, it is therefore possible to generate a signal which can be utilized, for example, for switching off the rechargeable battery pack.

In practice it has been found that, in the case of a large cell network of 10 or more individual cells situated one behind another in series, the successive interrogation of the potentials of all the cell connectors requires a time period of approximately 10 to 150 ms. Even the interrogation of two potentials to be compared on the right and left on a cell connector is between 1 and 25 ms. The electrical loading of the individual cells can change in the time period of an interrogation of the potentials of the respective cell connectors; however, a change in the electrical loading leads to a change in the potential at the cell connector itself, such that the detected potentials can no longer readily be compared with one another. Therefore, one feature of the invention provides for weighting or factorizing the detected potentials by multiplication with a predefined factor. The weighting factor is determined depending on the electrical loading at the instant of the measurement and the measured potential is correspondingly weighted with this factor. By virtue of the factor determined at the instant of the measurement, all detected potentials can be directly compared with one another and evaluated, independently of the electrical loading at the instant of the measurement. Changes in potential that have occurred on account of electrical loadings at the cell connectors do not corrupt the evaluation. Besides a weighting or factorization of the potentials depending on the present electrical loading, the factor can also be selected depending on the instant of the measurement, depending on a symmetrical or asymmetrical construction of the cell network in the rechargeable battery pack, or depending on a symmetrical or asymmetrical wiring harness of the rechargeable battery pack.

In a simple manner, the detected rechargeable battery pack and expediently factorized rechargeable battery pack potentials of the cell connectors situated at an identical location in the parallel cell row are directly compared with one another and a difference voltage is advantageously derived by subtraction, the magnitude of which difference voltage can be used directly for switching off the rechargeable battery pack. If the difference voltage exceeds a threshold value, a signal for switching off the rechargeable battery pack is output.

Advantageously, an evaluation unit is provided in a housing of the rechargeable battery pack, the potentials of the cell connectors—connected to compensation lines—of one cell row and the detected potentials of the corresponding cell connectors of a parallel cell row being fed to the evaluation unit. The evaluation unit can be embodied as a microprocessor and can perform the evaluation of the respectively detected potentials by means of a corresponding algorithm.

The individual cells provided in a cell row can be embodied as cell blocks, wherein a cell, block consists of at least one individual cell and the cell connectors form the electrical connection poles of the cell block. A cell block can also consist of a plurality of individual cells having e.g. in parallel connection common cell connectors as connection poles. Within a cell block, however, the individual cells can also be interconnected in a series circuit or in a combination of parallel and series connection.

Advantageously, a rechargeable battery block comprises more than two cell rows situated electrically in parallel with one another. All cell connectors situated at an identical location of the parallel cell row are advantageously electrically connected to one another via compensation lines. Within such a parallel circuit comprising a plurality of cell rows, the potentials of the cell connectors of the last cell row of the parallel circuit and of the first cell row of the parallel circuit are detected and evaluated. The cell rows are expediently the outer cell rows of a parallel circuit.

The switch for switching off the rechargeable battery pack is expediently situated in the housing of the rechargeable battery pack, such that, after a switch off on account of a defective individual cell, the rechargeable battery pack is prevented from being reactivated. An electronic switch, in particular a MOSFET, is expediently provided for switching off the rechargeable battery pack.

BRIEF DESCRIPTION OF THE DRAWINGS

The invention will new be described with reference to the drawings wherein.

DESCRIPTION OF THE PREFERRED EMBODIMENTS OF THE INVENTION

Figure 1:
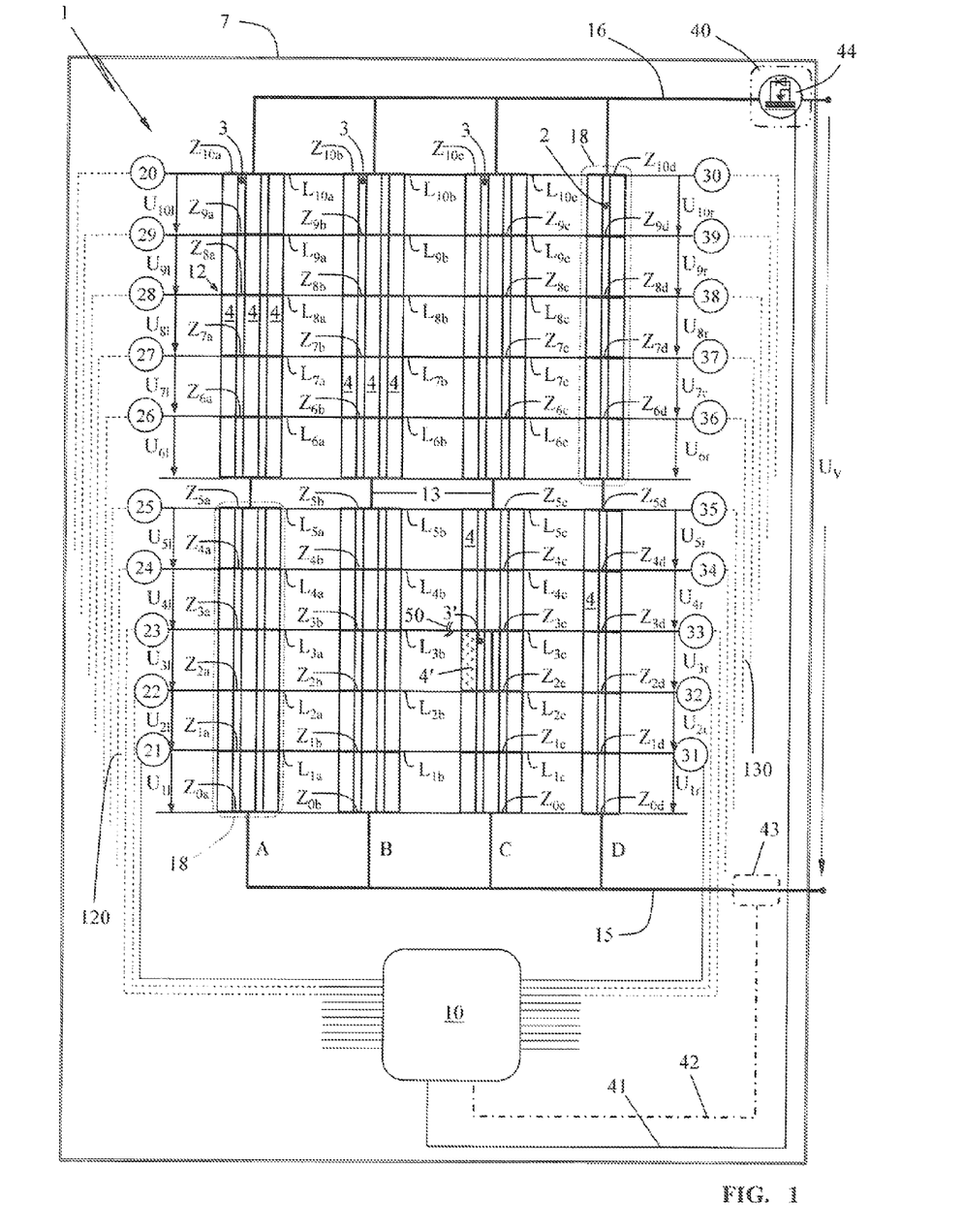
FIG. 1 shows, in schematic illustration, an electrical equivalent circuit diagram of a rechargeable battery pack.

In the exemplary embodiment according to FIG. 1, a rechargeable battery pack 1 constructed from a multiplicity of cell blocks (2, 3) is shown. In the embodiment shown, an identical number of cell blocks 2 and 3 are connected in series to form respective cell rows A, B, C and D. The cell rows A, B, C and D are in parallel with one another and are connected by their ends to the terminal poles 15 and 16 of the rechargeable battery pack 1. The external supply voltage $U_v$ is present between the terminal poles (15, 16).

In the embodiment, cell rows A, B, C and D each consist of ten cell blocks 2 or 3 connected in series one behind another. Here, in each case, five cell blocks (2, 3) form a structural unit 18. The structural units 18 of a cell row A, B, C and D are electrically connected to one another by a line segment, in particular a cable 13.

Figure 2:
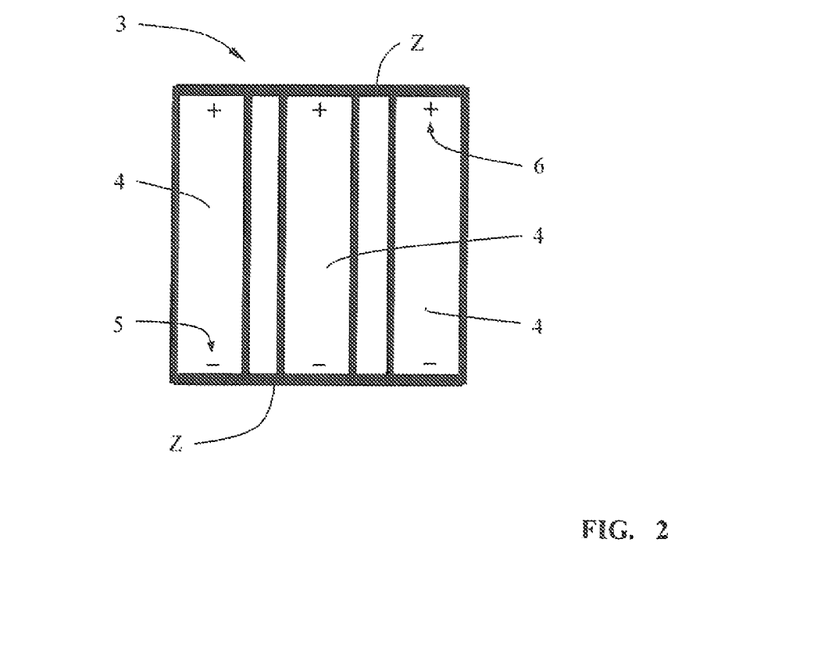
FIG. 2 shows, in schematic illustration, a cell block of the rechargeable battery pack according to FIG. 1.

A cell block 3 is reproduced by way of example in FIG. 2. In the embodiment shown, the cell block 3 consists of three individual cells 4, which are electrically connected in parallel and the terminals thereof are connected to respective cell connectors Z that form corresponding poles (5, 6) of the cell block 3.

Figure 4:
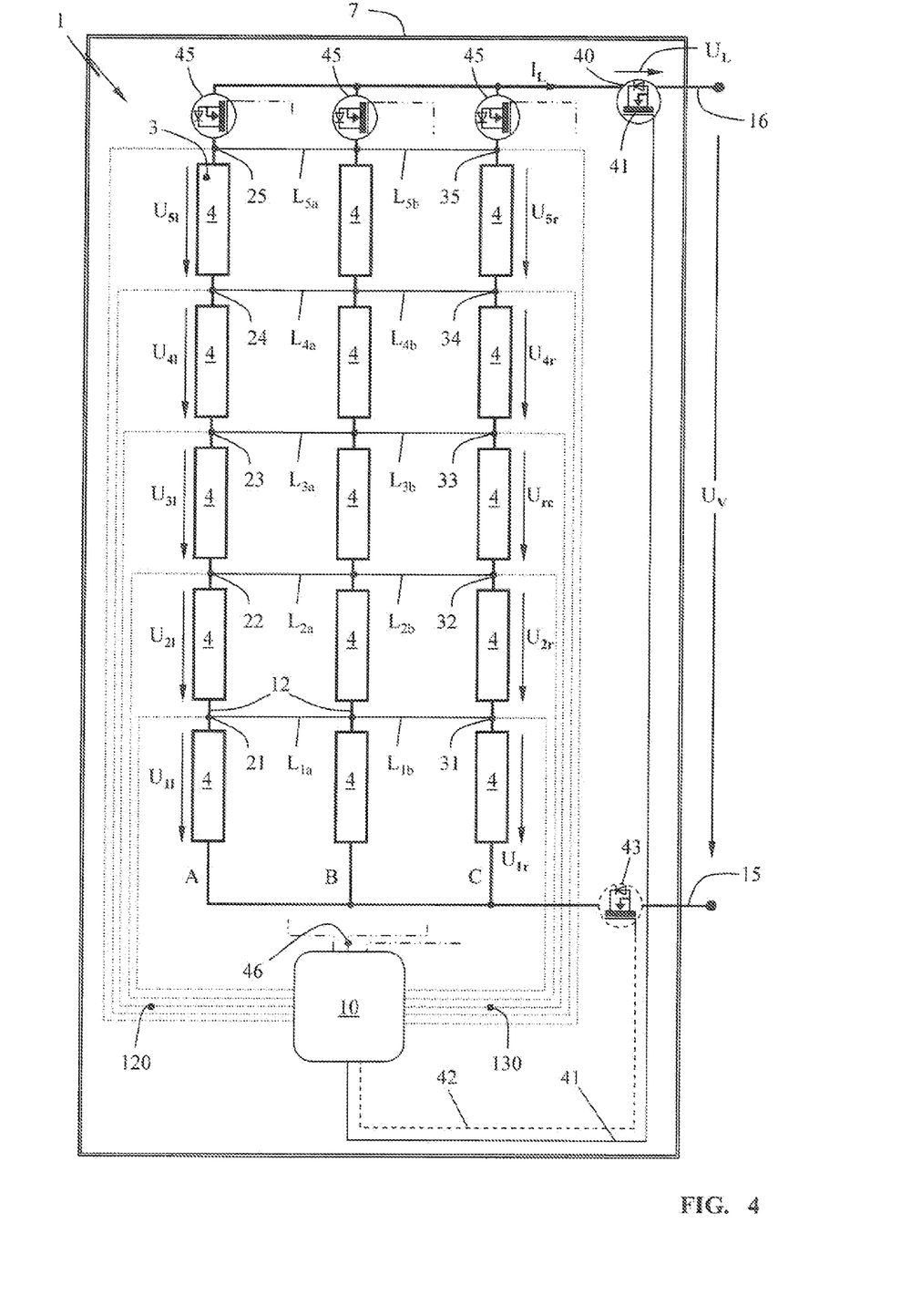
FIG. 4 shows, in schematic illustration, an electrical equivalent circuit diagram of a rechargeable battery pack in a different embodiment.

As shown in FIG. 1, the cell blocks 2 are formed from only two cells 4 connected in parallel; a cell block can also be formed from just one individual cell, as shown schematically in FIG. 4. Expediently, however, a cell block (2, 3) consists of a plurality of individual cells 4 which are electrically interconnected in parallel connection and/or in series connection.

The rechargeable battery pack 1 consisting of four parallel cell rows A, B, C, D in the exemplary embodiment according to FIG. 1 is provided with a multiplicity of compensation lines, which are generally designated by $L_{na}$, $L_{nb}$, $L_{nc}$, wherein n is a natural number, which can encompass the numbers "0" to "10" in the embodiment shown. The compensation lines ($L_{na}$, $L_{nb}$, $L_{nc}$) are provided as electrical cross connections between the cell rows A, B, C and D. The rechargeable battery pack in the embodiment illustrated has ten individual cells connected in series one behind another and thus provides a supply voltage of 36 volts. If a higher supply voltage is desired, for example, 72 volts, twenty individual cells are in series with one another; the number n is then in the range of $0 \leq n \leq 20$.

In the embodiment, cell connectors are situated between respective individual cells 4 and respective cell blocks 2 and 3 of rows (A, B, C, D), which cell connectors both connect the individual cells 4 of a cell block (2, 3) in parallel among one another and at the same time, as line segment 12 in accordance with FIG. 4, provide the electrical connection of the row of the cell blocks (2, 3) one behind another. As illustrated in FIG. 1, the cell row A has the cell connectors ($Z_{0a}$, $Z_{1a}$, $Z_{2a}$, $Z_{3a}$, $Z_{4a}$, $Z_{5a}$, $Z_{6a}$, $Z_{7a}$, $Z_{8a}$, $Z_{9a}$, $Z_{10a}$), which hereinafter are also designated as cell connectors $Z_{na}$ ($0 \leq n \leq 10$). Correspondingly, the cell row B has between the cell blocks 3 cell connectors $Z_{nb}$, that is, the cell connectors ($Z_{0b}$, $Z_{1b}$, $Z_{2b}$, $Z_{3b}$, $Z_{4b}$, $Z_{5b}$, $Z_{6b}$, $Z_{7b}$, $Z_{8b}$, $Z_{9b}$, $Z_{10b}$), which are generally designated by $Z_{nb}$ ($0 \leq n \leq 10$). The cell connectors between the cell blocks 3 of the cell row C are designated by $Z_{nc}$, that is, $Z_{0c}$, $Z_{1c}$, $Z_{2c}$, $Z_{3c}$, $Z_{4c}$, $Z_{5c}$, $Z_{6c}$, $Z_{7c}$, $Z_{8c}$, $Z_{9c}$, $Z_{10c}$, and are generally designated by $Z_{nc}$ ($0 \leq n \leq 10$). The cell connectors of the cell row D are designated by the reference sign $Z_{nd}$ ($0 \leq n \leq 10$), that is, $Z_{0d}$, $Z_{1d}$, $Z_{2d}$, $Z_{3d}$, $Z_{4d}$, $Z_{5d}$, $Z_{6d}$, $Z_{7d}$, $Z_{8d}$, $Z_{9d}$, $Z_{10d}$. In the case of a rechargeable battery pack having a supply voltage of 72 volts, twenty cell connectors $Z_{na}$ ($0 \leq n \leq 20$), twenty cell connectors $Z_{nb}$ ($0 \leq n \leq 20$), twenty cell connectors $Z_{nc}$ ($0 \leq n \leq 20$) and twenty cell connectors $Z_{nd}$ ($0 \leq n \leq 20$) are provided. Compensation lines $L_{na}$, $L_{nb}$, $L_{nc}$ where $0 \leq n \leq 20$ correspondingly lie between the cell connectors.

The cell connector $Z_{1a}$ is situated in the cell row A at the same first location as the cell connector $Z_{1b}$ in the cell row B, the cell connector $Z_{1c}$ in the cell row C and the cell connector $Z_{1d}$ in the cell row D. Accordingly, therefore, each cell connector $Z_{na}$ of the cell row A is situated at the same n-th location as the cell connector $Z_{nb}$ in the cell row B, the cell connector $Z_{nc}$ in the cell row C or the cell connector $Z_{nd}$ of the cell row D.

The compensation lines $L_{na}$, $L_{nb}$ and $L_{nc}$ respectively connect to one another the cell connectors $Z_{na}$, $Z_{nb}$, $Z_{nc}$ and $Z_{nd}$ of the cell rows A, B, C and D which are situated at the same n-th location in a cell row. Thus, the cell connector $Z_{6a}$ situated at the sixth location of the cell row is connected via the compensation line $L_{6a}$ to the cell connector $Z_{6b}$ situated at the sixth location in the cell row B, the cell connector $Z_{6b}$, for its part, being connected via the compensation line $L_{6b}$ to the cell connector $Z_{6c}$ of the cell row C situated at the sixth location of the cell row C. The cell connector $Z_{6c}$ is furthermore connected via the compensation line $L_{6c}$ to the cell connector $Z_{6d}$ situated at the sixth location of the cell row. Referring to the schematic circuit diagram illustrated in FIG. 1, the cell connectors situated at an n-th location in a cell rows (A, B, C, D) are therefore respectively connected via compensation lines ($L_{na}$, $L_{nb}$, $L_{nc}$) to the cell connectors of adjacent rows that are situated at the same n-th location. Thus, the cell connector $Z_{7c}$ is connected via the compensation lines $L_{7b}$ and $L_{7c}$ to the cell connectors $Z_{7b}$ and $Z_{7d}$ of the adjacent cell rows B and D that are situated at the same location. Accordingly, for example, the cell connector $Z_{2b}$ of the cell row B is connected via the compensation lines $L_{2a}$ and $L_{2b}$ to the adjacent cell connectors $Z_{2a}$ and $Z_{2c}$ situated at the same location of the cell rows A and C. Expressed in general terms, a cell connector ($Z_{na}$, $Z_{nb}$, $Z_{nc}$, $Z_{nd}$) situated at an n-th location of a cell row A, B, C or D between the cell blocks 2 or 3 is electrically connected via a compensation line ($L_{na}$, $L_{nb}$, $L_{nc}$) to the cell connectors ($Z_{na}$, $Z_{nb}$, $Z_{nc}$, $Z_{nd}$) situated at an identical n-th location of the parallel cell rows A, B, C or D.

The parallel circuit of a rechargeable battery pack 1 as illustrated in FIG. 1 has outer cell rows A and D and inner cell rows B and C. The cell connectors $Z_{nb}$ and $Z_{nc}$ of the inner cell rows B and C are each electrically connected to the cell connectors of adjacent cell rows situated on both sides of a cell row.

The cell connectors $Z_{na}$ and $Z_{nd}$ of the outer cell rows A and D form potential points 20 to 29 and 30 to 39, respectively. The voltages ($U_{1r}$, $U_{2r}$, $U_{3r}$, $U_{4r}$, $U_{5r}$, $U_{6r}$, $U_{7r}$, $U_{8r}$, $U_{9r}$, $U_{10r}$) ($U_{nr}$ $1 \leq n \leq 10$) and ($U_{1L}$, $U_{2L}$, $U_{3L}$, $U_{4L}$, $U_{5L}$, $U_{6L}$, $U_{7L}$, $U_{8L}$, $U_{9L}$, $U_{10L}$), ($U_{nL}$ $1 \leq n \leq 10$) present between the respective potential points are tapped off. Thus, the potentials of the potential points 20 to 29 on the left hand side of the rechargeable battery pack, that is to say the potential points 20 to 29 of the cell row A, are fed via signal lines 120 to the evaluation unit 10. Correspondingly, the potentials of the potential points 30 to 39 on the right hand side of the parallel circuit, that is to say the potential points 30 to 39 of the outer cell row D, are fed via signal lines 130 to the evaluation unit 10.

Within the evaluation unit 10, the detected voltages ($U_{nr}$, $U_{nl}$) or the detected potentials are evaluated and a signal is generated depending on the result of the evaluation. In this case, it can be expedient to factorize the respectively detected potential ($U_{nr}$, $U_{nl}$) before the evaluation, for example, depending on the instant of the measurement, the electrical loading of the rechargeable battery pack at the instant of the measurement, the structural construction of the rechargeable battery pack (symmetrical, asymmetrical) or the embodiment of the electrical cabling (symmetrical, asymmetrical) in the rechargeable battery pack. The signal generated as a result of the evaluation is preferably fed as a control signal via a control line 41 to a disconnecting switch 40, which is provided in the positive terminal pole 16 of the rechargeable battery pack 1 in the embodiment illustrated. Supplementary or alternatively, a disconnecting switch 43 can also be provided in the negative terminal pole 15, the disconnecting switch being driven by the evaluation unit 10 via the control line 42. The disconnecting switches 40 and 43 are arranged in the housing 7 of the rechargeable battery pack and serve for switching off the entire rechargeable battery pack 1 if the evaluation unit 10 generates a signal because of deviations of the detected potentials $U_{nr}$ and $U_{nl}$ and outputs the signal via the control line 41 or 42.

Preferably, the disconnecting switch 40 and 43 is provided as an electronic switch 44, in particular is embodied as a MOSFET.

During the operation of the rechargeable battery pack, compensation currents can flow via the compensation lines $L_{na}$, $L_{nb}$, $L_{nc}$ in order to compensate for unequal quantities of charge in the individual cells 4. The compensation lines $L_{na}$, $L_{nb}$, $L_{nc}$ are designed in such a way that they can reliably carry the compensation currents that occur during normal operation.

The compensation lines $L_{na}$, $L_{nb}$ and $L_{nc}$ are advantageously fashioned in such a way that they simultaneously serve as fuses between the cell rows or the cell blocks. If the compensation currents are within the permissible limits in normal operation, a charge distribution between the cell blocks is effected such that substantially approximately identical charge is stored in them. Therefore, the potentials at the potential points 20 to 29 will respectively correspond to the corresponding potentials at the potential points 30 to 39. The evaluation unit 10 will therefore detect, on the left hand side of the parallel circuit at the potential points 20 to 29, voltages $U_{nl}$ which approximately correspond to the voltages $U_{nr}$ that can be determined between the potential points 30 to 39 on the right hand side of the parallel circuit. If, by way of example, the voltage $U_{4r}$ is of approximately the same magnitude as the voltage $U_{4l}$, it can be assumed that the cell blocks $Z_{4a}$, $Z_{4b}$, $Z_{4c}$, and $Z_{4d}$ situated at the fourth location in the cell rows (A, B, C, D) are operating properly.

By contrast, if a defect occurs in only one individual cell 4', for example, in the third cell block 3' of the cell row C, then increased compensation currents will flow via the compensation lines $L_{2b}$ or $L_{2c}$ and $L_{3b}$ or $L_{3c}$. Since the compensation lines are advantageously simultaneously embodied as fuses, for example, the compensation line $L_{3b}$ will melt in the case of an excessively high current. An interruption 50 of the compensation line $L_{3b}$ is thus assumed in FIG. 3. On account of the now absent compensation current via the compensation line $L_{3b}$, the state of charge of the third cell block 3' will change more rapidly than those of the rest of the cell blocks (2, 3). As a result, however, the potential at the potential point 33 changes with respect to the potential of the potential point 23 on the left hand side of the parallel circuit. Therefore, on account of the potentials of the respective potential points 20 to 29 and 30 to 39 that are fed via the signal lines (120, 130), the evaluation unit 10 can recognize that the voltage $U_{3r}$ present between the potential points 32 and 33 deviates from the voltage $U_{3l}$ measured on the other side of the parallel circuit between the potential points 23 and 22. On account of the deviation, a signal is generated which, as a control signal, actuates the switches 40 and/or 43 in the rechargeable battery pack. The rechargeable battery pack 1 is switched off. Further damage to the individual cells is avoided.

Figure 3:
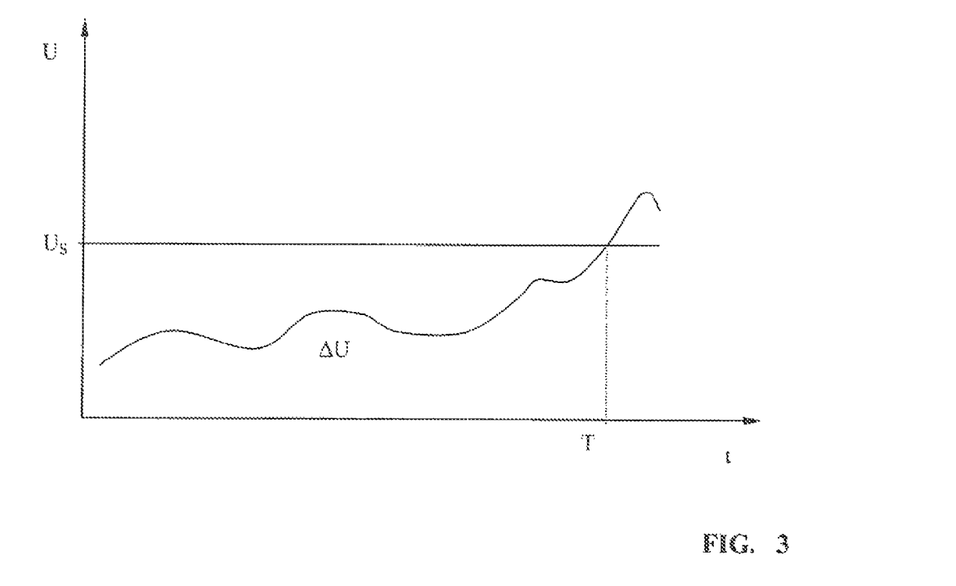
FIG. 3 shows a diagram for the evaluation of the detected potentials.

In a simple manner, the detected potentials $U_{nr}$ and $U_{nl}$ of the cell connectors situated at an identical n-th location are directly compared with one another and a difference voltage $\Delta U$ is formed, which is permanently compared with a threshold value $U_S$ (FIG. 3). In a rechargeable battery pack, the threshold value $U_S$ is preferably approximately 10 to 150 mV.

If the difference voltage ΔU exceeds the threshold value $U_S$ at the instant T, a signal is generated which results, for example, in the rechargeable battery pack being switched off. The fluctuations of the difference voltage ΔU that are illustrated in FIG. 3 can be attributed to compensation currents flowing during operation in the compensation lines; it is only if the compensation currents become too high or a compensation line is interrupted in accordance with its character as a fuse that the difference voltage ΔU rises above the threshold value $U_S$ and results in the rechargeable battery pack 1 being switched off.

In the embodiment, the individual cells 4 are based chemically on lithium; advantageously, the individual cells 4 are Li-ion cells, Li-polymer cells, LiFE cells or such like cells. The individual cells 4 can also have a different chemical structure, for example, NiCd, NiMh or the like.

The rechargeable battery pack 1 shown in FIG. 4 shows a further exemplary embodiment of an arrangement comprising a multiplicity of individual cells 4, the same reference signs as in FIG. 1 being used for identical parts. Five individual cells 4 are provided per cell rows A, B, C, wherein an electronic switch 45 can be arranged in each cell row A, B, C, the electronic switch being controlled by the evaluation unit 10 via a control line 46. The individual cells 4 of a row A, B, C are connected via line sections 12; in the exemplary embodiment according to FIG. 1, the line sections 12 are formed by the cell connectors ($Z_{na}$, $Z_{nb}$, $Z_{nc}$, $Z_{nd}$).

In a manner corresponding to the exemplary embodiment in FIG. 1, the cell voltages of the outer rows A and C are detected, for which purpose the potential points 21 to 25 and 31 to 35, respectively, are connected to the evaluation unit 10 via signal lines (120, 130).

A load current $I_L$ results in a measurable voltage drop $U_L$ across an internal resistance of the switch 40 or 43 of the connection poles (15, 16); the voltage drop $U_L$ can be detected and fed to the evaluation unit 10 as a present operating variable.

It is understood that the foregoing description is that of the preferred embodiments of the invention and that various changes and modifications may be made thereto without departing from the spirit and scope of the invention as defined in the appended claims.

What is claimed is:

1. A protective circuit for an arrangement having a plurality of individual cells in a battery pack, wherein a predetermined number of individual cells are connected in series via cell connectors so as to form a cell row and at least two cell rows are arranged in parallel, each of the individual cells of one cell row having a position which corresponds to the position of a corresponding one of the individual cells in the other cell row, each of the cell connectors of one cell row having a position therein which corresponds to the position of a corresponding one of the cell connectors in the other cell row, a plurality of compensation lines electrically interconnecting corresponding ones of the cell connectors of the different rows, the cell connectors being at respective potentials ($U_{nr}$, $U_{nl}$), the protective circuit comprising:
an evaluation unit;
a circuit device configured to detect the potential ($U_{nr}$) of the cell connector connected to the compensation line of one of the cell rows and the potential ($U_{nl}$) of the corresponding cell connector connected to said one compensation line of the other parallel cell row; and,
said circuit device being further configured to output the detected potentials ($U_{nl}$, $U_{nr}$) to said evaluation unit.

2. The protective circuit of claim 1, wherein said evaluation unit is configured to evaluate the potentials ($U_{nl}$, $U_{nr}$) and generate a signal in dependence upon its evaluation.

3. The protective circuit of claim 1, wherein said circuit device is configured to weight the detected potentials ($U_{nl}$, $U_{nr}$) via multiplication with a pregiven factor.

4. The protective circuit of claim 1, wherein said evaluation unit is configured to directly compare the detected potentials ($U_{nl}$, $U_{nr}$).

5. The protective circuit of claim 1, wherein said evaluation unit is configured to derive a differential voltage (ΔU) from the detected potentials ($U_{nl}$, $U_{nr}$) at the same positions of mutually parallel cell rows, compare said differential voltage (ΔU) to a predetermined limit value ($U_S$) and generate a signal in dependence upon whether said limit value ($U_S$) is exceeded.

6. The protective circuit of claim 1, wherein the cell rows are arranged in a housing of the battery pack, wherein:
said evaluation unit is arranged in the housing of the battery pack and is configured to receive the potential ($U_{nr}$) from the cell connector, which is connected to the compensation line, of the one cell row and the potential ($U_{nl}$) from the cell connector, which is connected to the compensation line, of the at least one other cell row.

7. A protective circuit for an arrangement having a plurality of individual cells in a battery pack, wherein at least one individual cell forms a cell block, a predetermined number of cell blocks are connected in series via cell connectors so as to form a cell row and at least two cell rows are arranged in parallel, the cell connectors form electrical connecting terminals of the cell blocks, each of the cell blocks of one cell row having a position which corresponds to the position of a corresponding one of the cell blocks in the other cell row, each of the cell connectors of one cell row having a position therein which corresponds to the position of a corresponding one of the cell connectors in the other cell row, a plurality of compensation lines electrically interconnecting corresponding ones of the cell connectors of the different rows, the cell connectors being at respective potentials ($U_{nr}$, $U_{nl}$), the protective circuit comprising:
an evaluation unit;
a circuit device configured to detect the potential ($U_{nr}$) of the cell connector connected to the compensation line of one of the cell rows and the potential ($U_{nl}$) of the corresponding cell connector connected to said one compensation line of the other parallel cell row; and,
said circuit device being further configured to output the detected potentials ($U_{nl}$, $U_{nr}$) to said evaluation unit.

8. The protective circuit of claim 7, wherein a plurality of individual cells form a cell block and the individual cells of each cell block are connected in parallel and/or in series.

9. The protective circuit of claim 1, wherein at least three cell rows are arranged in parallel and all of the cell connectors in said cell rows which lie at the same position of the parallel cell rows are electrically connected with each other via corresponding ones of said compensation lines at said same position.

10. The protective circuit of claim 9, wherein:
said circuit device is configured to detect the potential ($U_{nr}$) of the cell connectors of the first cell row and the potential ($U_{nl}$) of the cell connectors of the last cell row and supply the potentials ($U_{nr}$, $U_{na}$) to said evaluation unit; and,
said evaluation unit is configured to evaluate the potentials ($U_{nr}$, $U_{nl}$).

11. The protective circuit of claim 1, wherein
said evaluation unit is configured to generate a signal on the basis of the detected potentials; and,
said signal is configured to be applied to shut off the battery pack.

12. The protective circuit of claim 11, wherein the battery pack is arranged in a housing, the protective circuit further comprising:
a switch arranged in the housing and configured to shut off the battery pack.

13. The protective circuit of claim 12, wherein said switch is an electronic switch.

14. The protective circuit of claim 12, wherein said switch is a MOSFET.

15. The protective circuit of claim 1, wherein the compensation lines are configured as circuit interrupters.

16. The protective circuit of claim 1, wherein the individual cells are cells based on lithium.

17. The protective circuit of claim 1, wherein the individual cells are lithium ion cells.

18. The protective circuit of claim 11, wherein the battery pack is arranged in a housing, the protective circuit further comprising:
a switch arranged in the housing;
said evaluation unit being configured to transmit said signal to said switch; and,
said switch being configured to shut off the battery pack on the basis of said signal.

* * * * *

UNITED STATES PATENT AND TRADEMARK OFFICE
CERTIFICATE OF CORRECTION

PATENT NO. : 8,879,225 B2  
APPLICATION NO. : 13/726448  
DATED : November 4, 2014  
INVENTOR(S) : G. Liebhard et al.

Page 1 of 1

It is certified that error appears in the above-identified patent and that said Letters Patent is hereby corrected as shown below:

In the Specification

In column 3:
Line 50: delete "new" and substitute -- now -- therefor.

In the Claims

In column 8:
Line 64: delete "$(U_{nr}, U_{na})$" and substitute -- $(U_{nr}, U_{n1})$ -- therefor.

Signed and Sealed this
Twenty-fourth Day of February, 2015

Michelle K. Lee
*Deputy Director of the United States Patent and Trademark Office*